United States Patent
Oh et al.

(10) Patent No.: US 8,139,703 B2
(45) Date of Patent: Mar. 20, 2012

(54) DATA RELAY APPARATUS AND SEMICONDUCTOR INTEGRATED CIRCUIT HAVING THE SAME

(75) Inventors: Ic-Su Oh, Ichon (KR); Kun-Woo Park, Ichon (KR); Yong-Ju Kim, Ichon (KR); Hee-Woong Song, Ichon (KR); Hyung-Soo Kim, Ichon (KR); Tae-Jin Hwang, Ichon (KR); Hae-Rang Choi, Ichon (KR); Ji-Wang Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 1025 days.

(21) Appl. No.: 12/038,616

(22) Filed: Feb. 27, 2008

(65) Prior Publication Data

US 2009/0092215 A1    Apr. 9, 2009

(30) Foreign Application Priority Data

Oct. 9, 2007   (KR) .................. 10-2007-0101654

(51) Int. Cl.
*H03D 3/24* (2006.01)

(52) U.S. Cl. ........ 375/376; 375/354; 375/371; 455/260; 455/502; 455/516; 370/246; 370/501; 327/141; 327/147; 327/156

(58) Field of Classification Search .................. 375/354, 375/371, 376; 455/260, 502, 516; 370/246, 370/501; 327/141, 147, 156

See application file for complete search history.

(56) References Cited

U.S. PATENT DOCUMENTS

| | | | |
|---|---|---|---|
| 5,107,488 A * | 4/1992 | Schreder et al. | 370/315 |
| 6,956,440 B2 | 10/2005 | Choi | |
| 6,967,538 B2 | 11/2005 | Woo | |
| 7,234,070 B2 | 6/2007 | James | |
| 7,664,166 B2 * | 2/2010 | Palmer et al. | 375/211 |

FOREIGN PATENT DOCUMENTS

| | | |
|---|---|---|
| JP | 10229390 | 8/1998 |
| JP | 11055334 | 2/1999 |
| JP | 17124097 | 5/2005 |
| JP | 2006-004338 | 1/2006 |
| JP | 2007-096739 | 4/2007 |

* cited by examiner

*Primary Examiner* — Leon Flores
(74) *Attorney, Agent, or Firm* — Baker & McKenzie LLP

(57) ABSTRACT

A data relay apparatus according to one embodiment described herein can include a phase detection unit that can detect a phase difference between a clock output from a transmitter and a clock output from a receiver, and generate a plurality of phase detection signals, a data relay control unit that can distinguish a difference in clock timing between the clocks of the transmitter and the receiver in response to the plurality of phase detection signals, and output a relay data selection signal and a relay control clock, and a data relay unit that can transmit data output from the receiver to the transmitter in response to the relay data selection signal and the relay control clock.

22 Claims, 11 Drawing Sheets

DATA RELAY APPARATUS AND SEMICONDUCTOR INTEGRATED CIRCUIT HAVING THE SAME

CROSS-REFERENCE TO RELATED PATENT APPLICATION

The present application claims priority under 35 U.S.C. 119(a) of Korean Application No. 10-2007-0101654, filed on Oct. 9, 2007, in the Korean Intellectual Property Office, the disclosure of which is incorporated herein in its entirety by reference as if set forth in full.

BACKGROUND

1. Technical Field

The disclosure herein relates to a data relay apparatus and a semiconductor integrated circuit having the same, and in particular, to a data relay apparatus that relays data according to clock timing of a receiver and a transmitter, and a semiconductor integrated circuit having the same.

2. Related Art

A conventional semiconductor integrated circuit includes a receiver and a transmitter to perform a data transmission/reception operation. The semiconductor integrated circuit is demanded to continuously perform a high-speed operation. Accordingly, in a recent semiconductor integrated circuit, each circuit region includes a PLL (Phase Locked Loop) circuit, and generates a clock that synchronizes with timing of input data. The receiver and the transmitter operate on the basis of clocks, which are generated from each of the PLL circuit, respectively. The clocks are generated in different forms according to data input timing.

As such, if the clocks of the receiver and the transmitter have different toggle timing, data that is transmitted from the receiver to the transmitter is rarely accurately transmitted due to a phase difference between the clocks, and accordingly stability in using the receiver and the transmitter is deteriorated. In order to prevent the stability of the data transmission/reception operation from being deteriorated, it is necessary to relay data in consideration of the phase difference between the clock of the receiver and the clock of the transmitter. However, the known semiconductor integrated circuit does not perform the data relay operation in consideration of the phase difference between the clocks. As a result, there is a limitation in implementing a high-speed semiconductor integrated circuit.

SUMMARY

A data relay apparatus that relays data in consideration of clock timings of a receiver and a transmitter, and a semiconductor integrated circuit having the same are described herein.

According to one aspect, a data relay apparatus can have improved stability of a data transmission/reception operation during a high-speed operation, and a semiconductor integrated circuit having the same.

According to another aspect a data relay apparatus can include a phase detection unit that can detect a phase difference between a clock output from a transmitter and a clock output from a receiver, and can generate a plurality of phase detection signals, a data relay control unit that can distinguish a difference in clock timing between the transmitter and the receiver in response to the plurality of phase detection signals, and can output a relay data selection signal and a relay control clock, and a data relay unit that can transmit data output from the receiver to the transmitter in response to the relay data selection signal and the relay control clock.

According to another aspect, a semiconductor integrated circuit can include a first PLL circuit that can generate a first PLL clock, a receiver that can receive data outside a chip and synchronizes the received data with the first PLL clock, a storage unit that can operate under the control of the first PLL clock and store output data of the receiver, a second PLL circuit that can generate a second PLL clock, a data relay apparatus that can delay output data of the storage unit according to a phase difference between the first PLL clock and the second PLL clock, and a transmitter that can transmit output data of the data relay apparatus to the outside of the chip in synchronization with the second PLL clock.

According to still another aspect, a semiconductor integrated circuit can includes a first PLL circuit that can generate a first PLL clock, a receiver that can receive data outside a chip and synchronize the received data with the first PLL clock, a second PLL circuit that can generate a second PLL clock, a data relay apparatus that can delay output data of the receiver according to a phase difference between the first PLL clock and the second PLL clock, a storage unit that can operate under the control of the second PLL clock and store output data of the data relay apparatus, and a transmitter that can transmit output data of the storage unit to the outside of the chip in synchronization with the second PLL clock.

The data relay unit can include a circuit that, in response to a multi-level data enable signal, which can define a multi-level data transmission/reception operation, can relay multi-level received data to be transmitted from the storage unit.

The data relay apparatus can further include an initialization unit that, in response to an initialization control signal, can generate a distinguishment initialization signal, which can initialize the operation of the timing distinguishing unit.

The multi-level data enable signal and the initialization control signal can be signals transmitted from a controller outside a chip or an MRS (Mode Register Set) circuit inside the chip.

DETAILED DESCRIPTION

Figure 1:
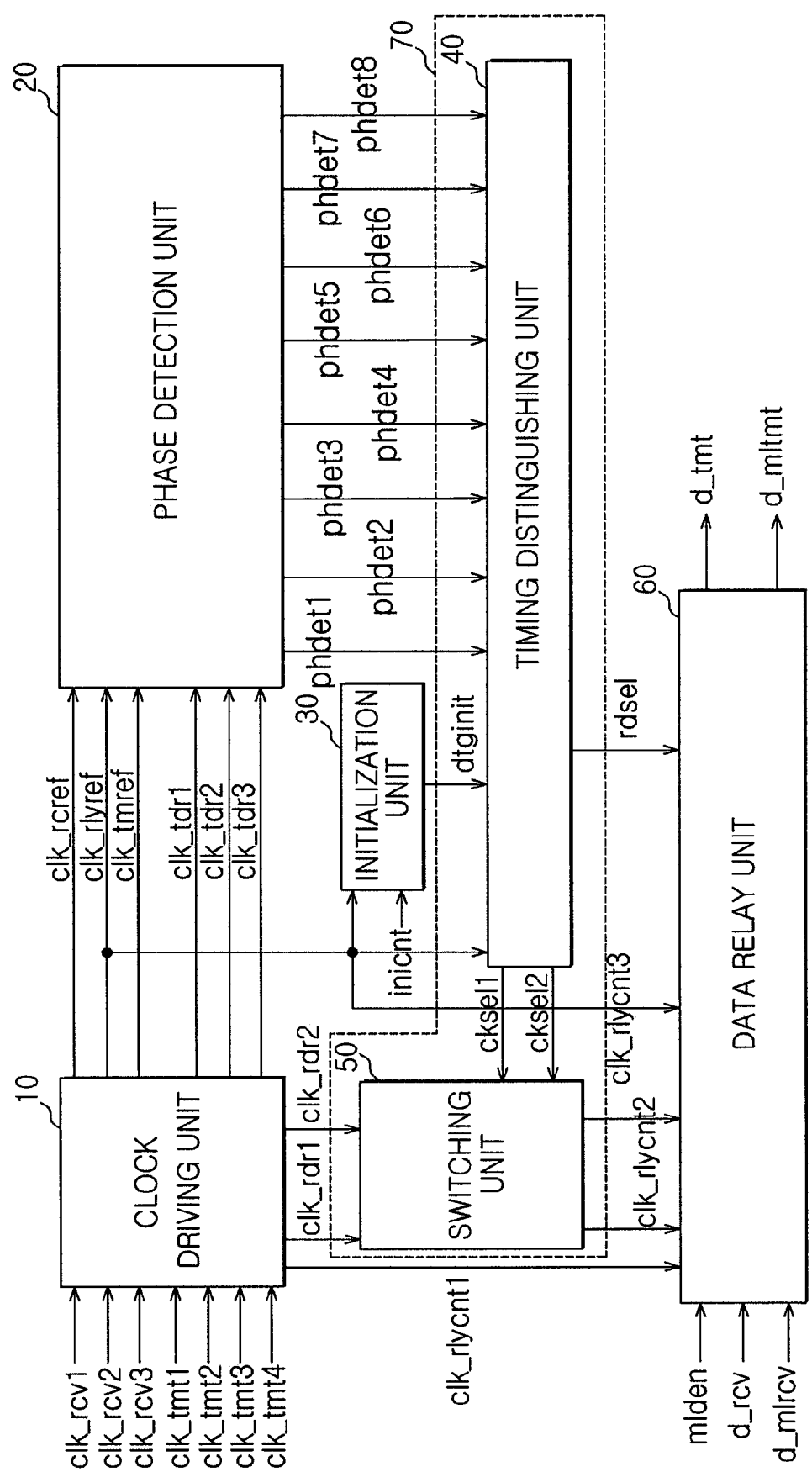
FIG. 1 is a block diagram showing the configuration of a data relay apparatus according to one embodiment.

FIG. 1 is a block diagram showing the configuration of a data relay apparatus according to one embodiment. Referring to FIG. 1, a data relay apparatus can include a clock driving unit 10, a phase detection unit 20, an initialization unit 30, a timing distinguishing unit 40, a switching unit 50, and a data relay unit 60.

The clock driving unit 10 can drive first to third receiver clocks "clk_rcv1" to "clk_rcv3", and generate first and second reception driving clocks "clk_rdr1" and "clk_rdr2", a reception reference clock "clk_rcref", and a first relay control clock "clk_rlycnt1". In addition, the clock driving unit 10 can drive first to fourth transmitter clocks "clk_tmt1" to "clk_tmt4", and generate a relay reference clock "clk_rlyref", a transmission reference clock "clk_tmref", and first to third transmission driving clocks "clk_tdr1" to "clk_tdr3".

Here, the first to third receiver clocks "clk_rcv1" to "clk_rcv3" are clocks that can be transmitted from a receiver and can have different timing from each other by ¼ cycle. The reception reference clock "clk_rcref" can be transmitted to the phase detection unit 20 and can provide the reference value of the receiver clock in comparing the receiver clock with the transmitter clock. The first relay control clock "clk_rlycnt1" can be transmitted to the data relay unit 60 and can control relay received data "d_rcv" or multi-level received data "d_mlrcv". The first reception driving clock "clk_rdr1" and the second reception driving clock "clk_rdr2" can be implemented having different timing from each other by half cycle.

Similarly, the first to third transmitter clocks "clk_tmt1" to "clk_tmt4" are clocks that can be transmitted from a transmitter and have different timing from each other by 1/16 cycle. The first to third transmission driving clocks "clk_tdr1" and "clk_tdr3" and the relay reference clock "clk_rlyref" also can have different timing from each other by 1/16 cycle, and the transmission reference clock "clk_tmref" can have a phase opposite to the relay reference clock "clk_rlyref". The relay reference clock "clk_rlyref" controls the operations of the phase detection unit 20, the initialization unit 30, the timing distinguishing unit 40, and the data relay unit 60.

That is, the clock driving unit 10 can receive the clocks from the receiver and the transmitter, drive the received clocks, and distribute the driven clocks to the individual components of the data relay apparatus.

The phase detection unit 20 can detect the phase of the reception reference clock "clk_rcref" in response to the relay reference clock "clk_rlyref", the transmission reference clock "clk_tmref", and the first to third transmission driving clocks "clk_tdr1" to "clk_tdr3", and can generate first to eighth phase detection signals "phdet1" to "phdet8". The phase detection unit 20 can be implemented with an edge trigger that can detect the level of the reception reference clock "clk_rcref" at a rising edge of each of the first to third transmission driving clocks "clk_tdr1" to "clk_tdr3" and the relay reference clock "clk_rlyref". The phase detection unit 20 can extract information on a phase difference between the clock of the receiver and the clock of the transmitter. Then, the extracted information on the phase difference can be output as the first to eighth phase detection signals "phdet1" to "phdet8" under the control of the transmission reference clock "clk_tmref". At this time, the first phase detection signal "phdet1" and the fifth phase detection signal "phdet5", the second phase detection signal "phdet2" and the sixth phase detection signal "phdet6", the third phase detection signal "phdet3" and the seventh phase detection signal "phdet7", and the fourth phase detection signal "phdet4" and the eighth phase detection signal "phdet8" can have a phase difference by one cycle of the relay reference clock "clk_rlyref".

The initialization unit 30 can generate a distinguishment initialization signal "dtginit" in response to the relay reference clock "clk_rlyref" and an initialization control signal "inicnt". The initialization control signal "inicnt" can then be transmitted from a controller outside a chip, which can include the data relay apparatus, or a circuit, such as an MRS (Mode Register Set) circuit, inside the chip. The distinguishment initialization signal "dtginit" can initialize the operation of the timing distinguishing unit 40.

The timing distinguishing unit 40 can distinguish a difference in clock timing between the transmitter and the receiver in response to the distinguishment initialization signal "dtginit", the relay reference clock "clk_rlyref", and the first to eighth phase detection signals "phdet1" to "phdet8", and generate a relay data selection signal "rdsel" and first and second clock selection signals "cksel1" and "cksel2". The timing distinguishing unit 40 can combine the first to eighth phase detection signals "phdet1" to "phdet8" to generate signals in various forms after the distinguishment initialization signal "dtginit" is enabled, and output the generated signals as the first clock selection signal "cksel1", the second clock selection signal "cksel2", and the relay data selection signal "rdsel" under the control of the relay reference clock "clk_rlyref".

The switching unit 50 can selectively output the first reception driving clock "clk_rdr1" or the second reception driving clock "clk_rdr2" as second and third relay control clock "clk_rlycnt2" and "clk_rlycnt3" in response to the first and second clock selection signals "cksel1" and "cksel2". Here, the first and second clock selection signals "cksel1" and "cksel2" can have the phase information of the clocks of the receiver and the transmitter. The first reception driving clock "clk_rdr1" and the second reception driving clock "clk_rdr2" can have a phase difference from each other by half cycle. Then, the first reception driving clock "clk_rdr1" or the second reception driving clock "clk_rdr2" can be selectively output as the second relay control clock "clk_rlycnt2" according to the first clock selection signal "cksel1", and can be selectively output as the third relay control clock "clk_rlycnt3" according to the second clock selection signal "cksel2".

The timing distinguishing unit 40 and the switching unit 50 can be called a data relay control unit 70. That is, the data relay control unit 70 can distinguish the difference in clock timing between the transmitter and the receiver in response to the distinguishment initialization signal "dtginit", the relay reference clock "clk_rlyref", and the first to eighth phase detection signals "phdet1" to "phdet8", and can output the relay data selection signal "rdsel" and the second and third relay control clocks "clk_rlycnt2" and "clk_rlycnt3".

The data relay unit 60 can output the received data "d_rcv" and the multi-level received data "d_mlrcv" as transmitted data "d_tmt" and multi-level transmitted data "d_mltmt" in response to a multi-level data enable signal "mlden", the relay reference clock "clk_rlyref", the relay data selection signal "rdsel", and the first to third relay control clocks "clk_rlycnt1" to "clk_rlycnt3". Here, similarly to the initialization control signal "inicnt", the multi-level data enable signal "mlden" can be transmitted from a controller outside the chip or the circuit, such as the MRS circuit, inside the chip. The multi-level received data "d_mlrcv" is data, the bits of which can represent a plurality of information with voltage levels. The multi-level received data "d_mlrcv" can be used in a multi-level transmission/reception technology for a high-speed data transmission/reception operation. The data relay unit 60 can relay the received data "d_rcv" and the multi-level received data "d_mlrcv" when the multi-level data enable signal "mlden" is enabled. Meanwhile, the data relay unit 60 can relay the received data "d_rcv" when the multi-level data enable signal "mlden" is disabled.

The data relay unit 60 can sequentially latch the received data "d_rcv" or the multi-level received data "d_mlrcv" under the control of the first to third relay control clocks "clk_rlycnt1" to "clk_rlycnt3", and then can readjusts the timing of the latched data under the control of the relay data selection signal "rdsel". Subsequently, the data relay unit 60 can latch the timing-adjusted data under the control of the relay reference clock "clk_rlyref", and output the latched data as the transmitted data "d_tmt" or the multi-level transmitted data "d_mltmt".

As such, the data relay apparatus can extract the phase information of the clocks of the receiver and the transmitter, control the timing of the data to be transmitted from the receiver, and transmit the timing-controlled data to the transmitter. With this operation, the semiconductor integrated circuit can perform a stable data transmission/reception operation during a high-speed operation.

Figure 2:
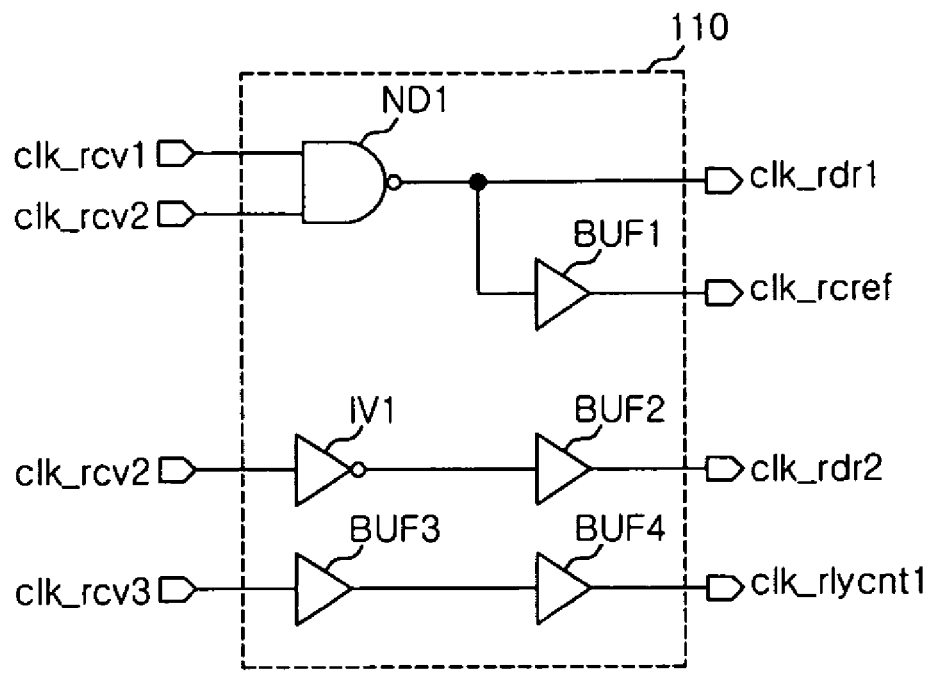
FIG. 2 is a diagram showing a detailed configuration of a clock driving unit that can be included in the circuit illustrated in FIG. 1.
Figure 2:
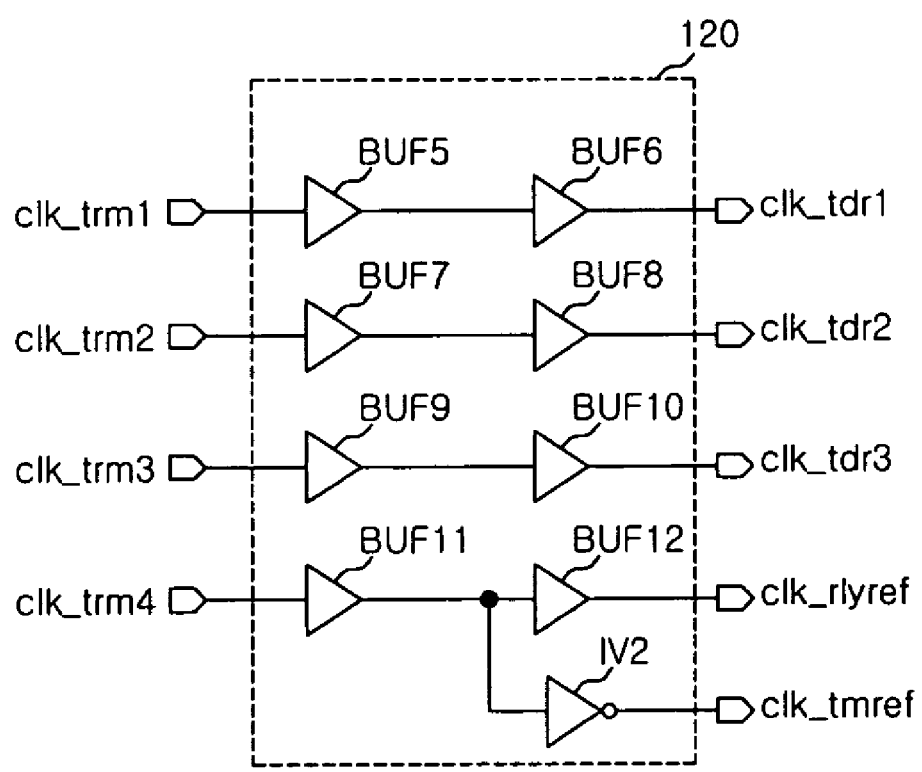

FIG. 2 is a diagram showing a detailed configuration of a clock driving unit that can be included in the circuit illustrated in FIG. 1. Referring to FIG. 2, the clock driving unit 10 can include a receiver clock driving section 110 and a transmitter clock driving section 120.

The receiver clock driving section 110 can drive the first to third receiver clocks "clk_rcv1" to "clk_rcv3", and can generate the first and second reception driving clocks "clk_rdr1" and "clk_rdr2", the reception reference clock "clk_rcref", and the first relay control clock "clk_rlycnt1". The receiver clock driving section 110 includes a first NAND gate ND1, a first inverter IV1, and first to fourth buffers BUF1 to BUF4.

The first NAND gate ND1 can receive the first receiver clock "clk_rcv1" and the second receiver clock "clk_rcv2", and output the first reception driving clock "clk_rdr1". The first buffer BUF1 can receive the first reception driving clock "clk_rdr1" and can output the reception reference clock "clk_rcref". The first inverter IV1 can receive the second receiver clock "clk_rcv2". The second buffer BUF2 can receive an output signal of the first inverter IV1 and can output the second reception driving clock "clk_rdr2". The third buffer BUF3 can receives the third receiver clock "clk_rcv3". The fourth buffer BUF4 can receive an output signal of the third buffer "BUF3" and can output the first relay control clock "clk_rlycnt1".

The transmitter clock driving section 120 can drive the first to fourth transmitter clocks "clk_tmt1" to "clk_tmt4", and generate the relay reference clock "clk_rlyref", the transmission reference clock "clk_tmref", and the first to third transmission driving clocks "clk_tdr1" to "clk_tdr3". The transmitter clock driving section 120 can include fifth to twelfth buffers "BUF5" to "BUF12", and a second inverter "IV2".

The fifth buffer BUF5 can receive the first transmitter clock "clk_trm1". The sixth buffer BUF6 can receive an output signal of the fifth buffer "BUF5" and output the first transmission driving clock "clk_tdr1". The seventh buffer "BUF7" can receive the second transmitter clock "clk_trm2". The eighth buffer "BUF8" can receive an output signal of the seventh buffer "BUF7" and can output the second transmission driving clock "clk_tdr2". The ninth buffer "BUF9" can receives the third transmitter clock "clk_tmt3". The tenth buffer "BUF10" can receives an output signal of the ninth buffer "BUF9" and output the third transmission driving clock "clk_tdr3". The eleventh buffer "BUF11" can receive the fourth transmitter clock "clk_tmt4". The twelfth buffer "BUF12" can receives an output signal of the eleventh buffer "BUF11" and can output the relay reference clock "clk_rlyref". The second inverter "IV2" can receives an output signal of the eleventh buffer "BUF11" and output the transmission reference clock "clk_tmref".

Figure 3:
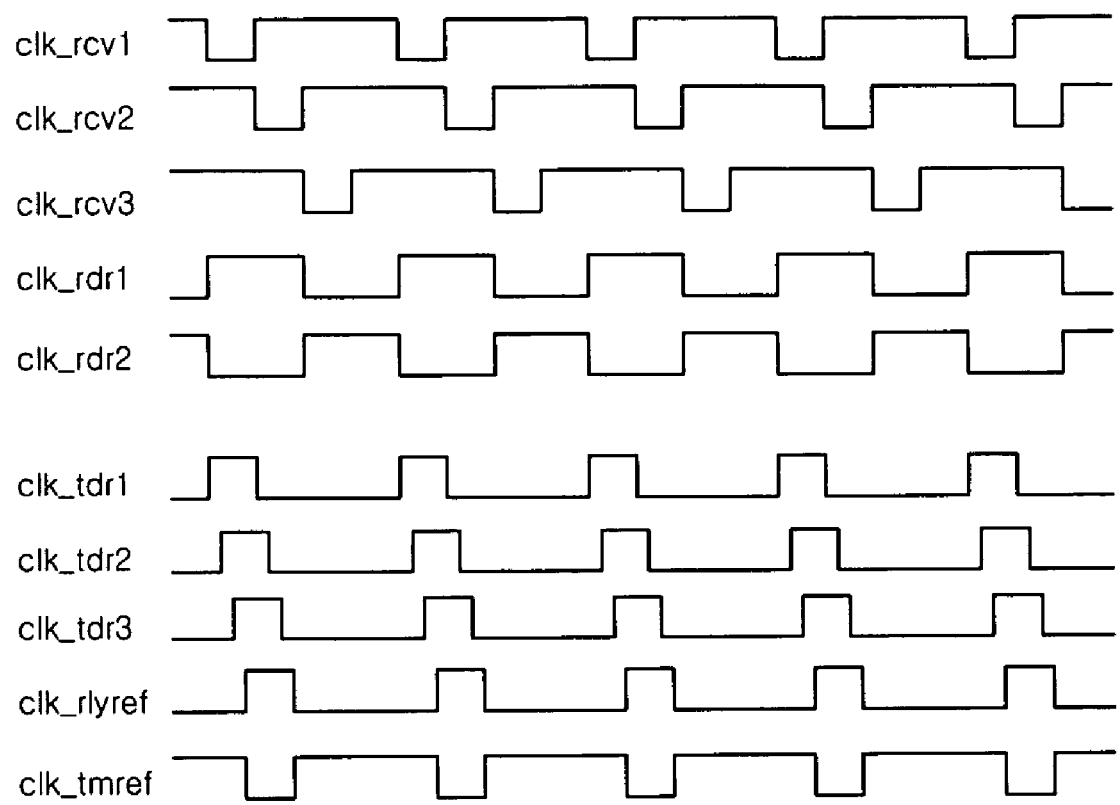
FIG. 3 is a timing chart illustrating the operation of the clock driving unit that can be included in the circuit illustrated in FIG. 2.

FIG. 3 is a timing chart illustrating the operation of the clock driving unit that can be included in the circuit illustrated in FIG. 2. FIG. 3 shows the waveforms of the first to third receiver clocks "clk_rcv1" to "clk_rcv3". In addition, FIG. 3 shows the waveforms of the first and second reception driving clocks "clk_rdr1" and "clk_rdr2", the reception reference clock "clk_rcref", the relay reference clock "clk_rlyref", the transmission reference clock "clk_tmref", and the first to third transmission driving clocks "clk_tdr1" to "clk_tdr3", which can be generated by the above-described configuration. As can be seen from FIG. 3, the first to third receiver clocks "clk_rcv1" to "clk_rcv3" can have a phase difference from each other by ¼ cycle, and the first and second reception driving clocks "clk_rdr1" and "clk_rdr2" can have a phase difference from each other by half cycle. In addition, the first to third transmission driving clocks "clk_tdr1" to "clk_tdr3" and the relay reference clock "clk_rlyref" can have a phase difference from each other by 1/16 cycle, and the transmission reference clock "clk_tmref" can have a phase opposite to the relay reference clock "clk_rlyref".

Figure 4:
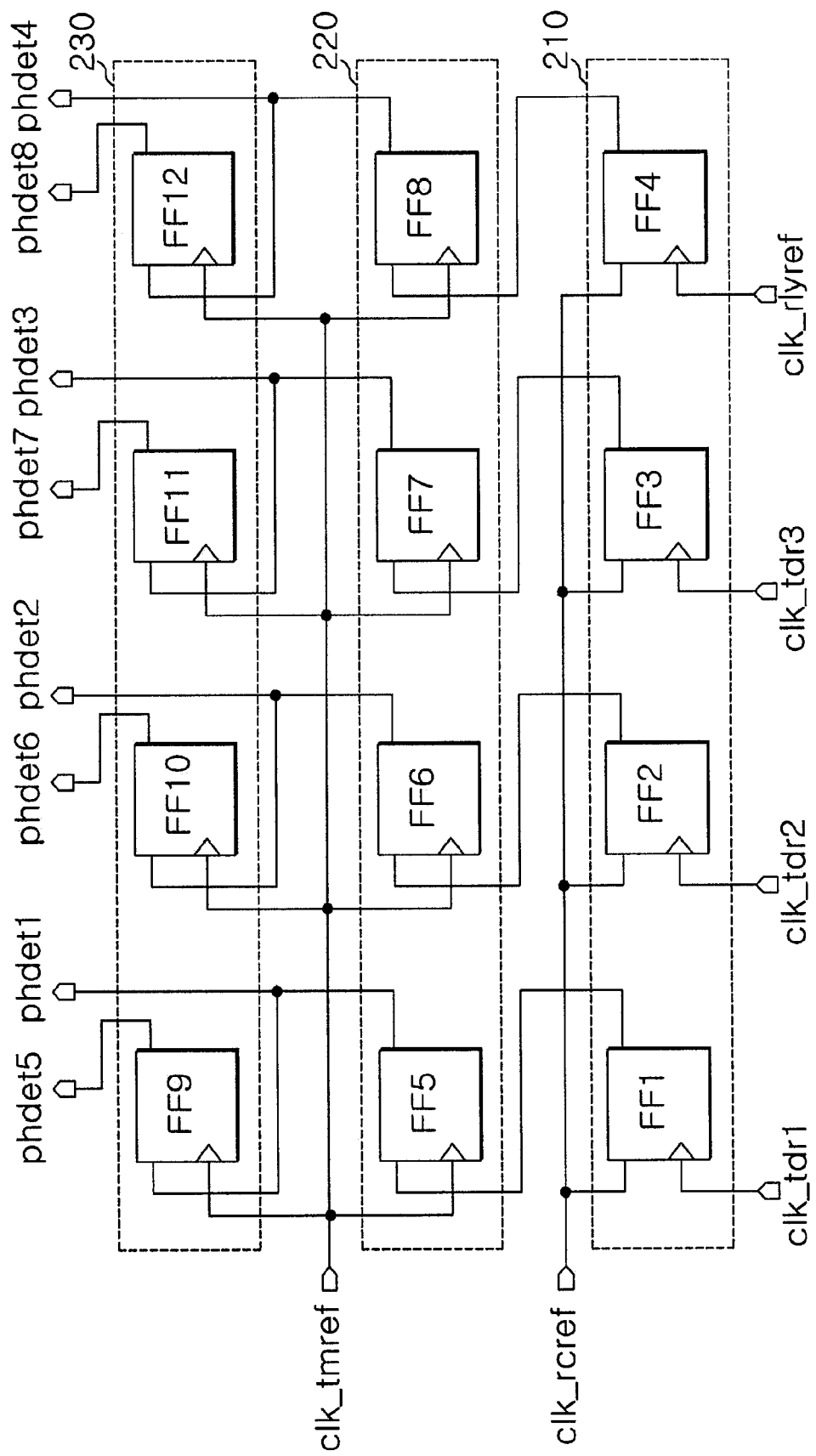
FIG. 4 is a diagram showing the detailed configuration of a phase detection unit that can be included in the circuit illustrated in FIG. 1.

FIG. 4 is a diagram showing the detailed configuration of a phase detection unit that can be included in the circuit illustrated in FIG. 1. Referring to FIG. 4, the phase detection unit 20 can include a first latch section 210, a second latch section 220, and a third latch section 230.

The first latch section 210 can latch the reception reference clock "clk_rcref" in synchronization with toggle timing of each of the first to third transmission driving clocks "clk_tdr1" to "clk_tdr3" and the relay reference clock "clk_rlyref". The first latch section 210 can include first to fourth flip-flops "FF1" to "FF4".

The first flip-flop "FF1" can latch the reception reference clock "clk_rcref" in response to the first transmission driving clock "clk_tdr1". The second flip-flop "FF2" can latch the reception reference clock "clk_rcref" in response to the second transmission driving clock "clk_tdr2". The third flip-flop "FF3" can latch the reception reference clock "clk_rcref" in response to the third transmission driving clock "clk_tdr3". The fourth flip-flop "FF4" can latch the reception reference clock "clk_rcref" in response to the relay reference clock "clk_rlyref".

The second latch section 220 can latch the signals output from the first latch section 210 in synchronization with toggle timing of the transmission reference clock "clk_tmref", and can generate the first to fourth phase detection signals "phdet1" to "phdet4". The second latch section 220 can include fifth to eighth flip-flops "FF5" to "FF8".

The fifth flip-flop "FF5" can latch an output signal of the first flip-flop "FF1" in response to the transmission reference clock "clk_tmref", and output the first phase detection signal "phdet1". The sixth flip-flop "FF6" can latch an output signal of the second flip-flop "FF2" in response to the transmission reference clock "clk_tmref", and output the second phase detection signal "phdet2". The seventh flip-flop "FF7" can latch an output signal of the third flip-flop "FF3" in response to the transmission reference clock "clk_tmref", and output the third phase detection signal "phdet3". The eighth flip-flop "FF8" can latch an output signal of the fourth flip-flop "FF4" in response to the transmission reference clock "clk_tmref", and output the fourth phase detection signal phdet4.

The third latch section 230 can latch the first to fourth phase detection signals "phdet1" to "phdet4" in synchronization with the toggle timing of the transmission reference clock "clk_tmref", and generate the fifth to eighth phase detection signals "phdet5" to "phdet8". The third latch section 230 can include ninth to twelfth flip-flops "FF9" to "FF12".

The ninth flip-flop "FF9" can latch the first phase detection signal "phdet1" in response to the transmission reference clock "clk_tmref", and output the fifth phase detection signal "phdet5". The tenth flip-flop "FF10" can latch the second phase detection signal "phdet2" in response to the transmission reference clock "clk_tmref", and output the sixth phase detection signal "phdet6". The eleventh flip-flop "FF11" can latch the third phase detection signal "phdet3" in response to the transmission reference clock "clk_tmref", and can output the seventh phase detection signal "phdet7". The twelfth flip-flop "FF12" can latch the fourth phase detection signal "phdet4" and can output the eighth phase detection signal "phdet8".

With this configuration, the phase detection unit 20 can receive the phase information of the clock of the transmitter, which can be provided by the first to third transmission driving clocks "clk_tdr1" to "clk_tdr3", the relay reference clock "clk_rlyref", and the transmission reference clock "clk_tmref", and the phase information of the clock of the receiver, which can be provided by the reception reference clock "clk_rcref", and can extract the information on the phase difference. That is, the phase information of the reception reference clock "clk_rcref" can be extracted on the basis of the phase difference between the first to third transmission driving clocks "clk_tdr1" to "clk_tdr3" and the relay reference clock "clk_rlyref". Then, the extracted phase information can be expressed by the logical values of the first to eighth phase detection signals "phdet1" to "phdet8".

Figure 5:
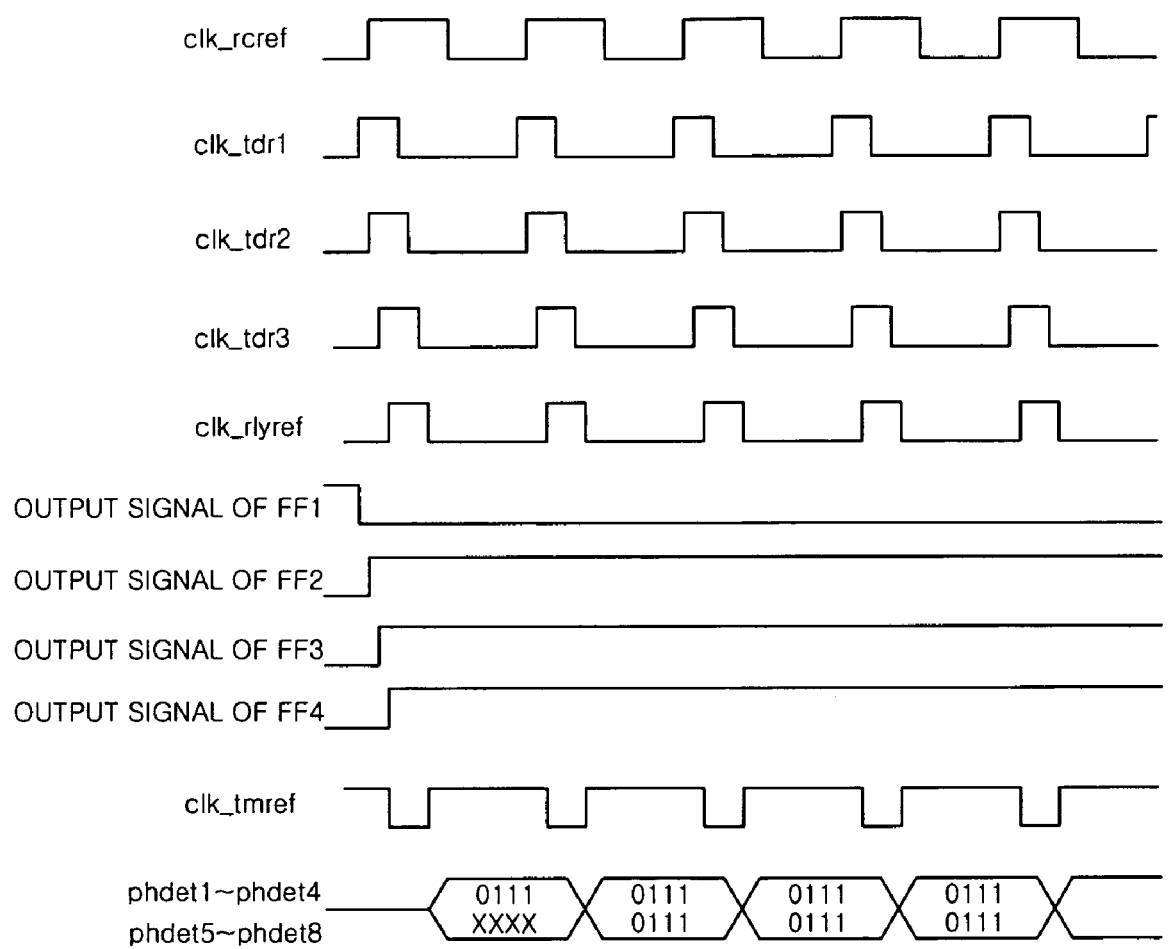
FIG. 5 is a timing chart illustrating the operation of the phase detection unit that can be included in the circuit illustrated in FIG. 4.

FIG. 5 is a timing chart illustrating the operation of the phase detection unit that can be included in the circuit illustrated in FIG. 4. Referring to FIG. 5, the operation of the phase detection unit 20 can be easily understood. As can be seen from FIG. 5, the logical value of the reception reference clock "clk_rcref" at the rising edge of each of the first to third transmission driving clocks "clk_tdr1" to "clk_tdr3" and the relay reference clock "clk_rlyref" can be reflected in the logical values of the output signals of the first to fourth flip-flops "FF1" to "FF4". Then, the first to fourth phase detection signals "phdet1" to "phdet4" can have the logical values according to the output signals of the first to fourth flip-flops "FF1" to "FF4". In addition, the fifth to eighth phase detection signals "phdet5" to "phdet8" can have the logical values of the first to fourth phase detection signals "phdet1" to "phdet4" before one cycle of the transmission reference clock "clk_tmref".

Figure 6:
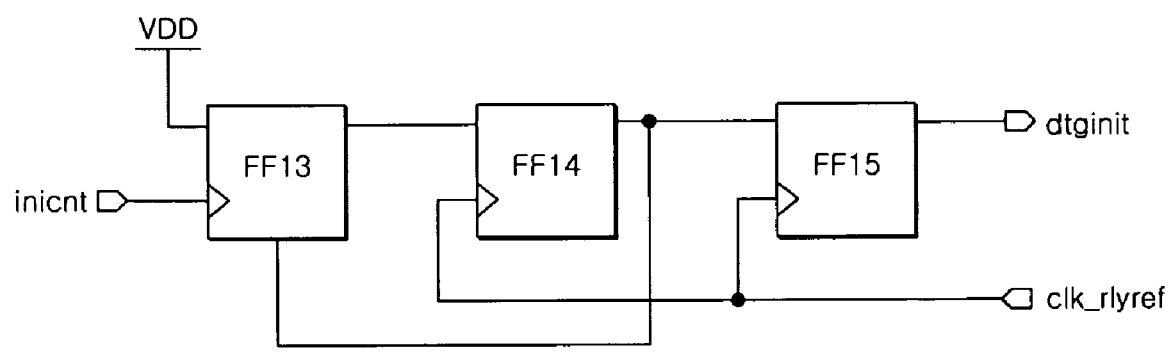
FIG. 6 is a diagram showing the detailed configuration of an initialization unit that can be included in the circuit illustrated in FIG. 1.

FIG. 6 is a diagram showing the detailed configuration of an initialization unit that can be included in the circuit illustrated in FIG. 1. Referring to FIG. 6, the initialization unit 30 can includes thirteenth to fifteenth flip-flops "FF13" to "FF15".

The thirteenth flip-flop "FF13" can be reset in response to an output signal of the fourteenth flip-flop "FF14", and latch an external voltage (VDD) in response to the initialization control signal "inicnt". The fourteenth flip-flop "FF14" can latch an output signal of the thirteenth flip-flop "FF13" in response to the relay reference clock "clk_rlyref". The fifteenth flip-flop "FF15" can latch an output signal of the fourteenth flip-flop "FF14" in response to the relay reference clock "clk_rlyref", and can output the distinguishment initialization signal "dtginit".

The distinguishment initialization signal "dtginit" that can be generated by the initialization unit 30 having the above-described configuration can be enabled for a time corresponding to one cycle of the relay reference clock "clk_rlyref" in a pulse type after the initialization control signal "inicnt" is enabled in a pulse type. The reason why the distinguishment initialization signal "dtginit" can be generated in the pulse type is that the thirteenth flip-flop "FF13" has already been reset by the output signal of the fourteenth flip-flop "FF14" before the distinguishment initialization signal "dtginit" is enabled.

Figure 7:
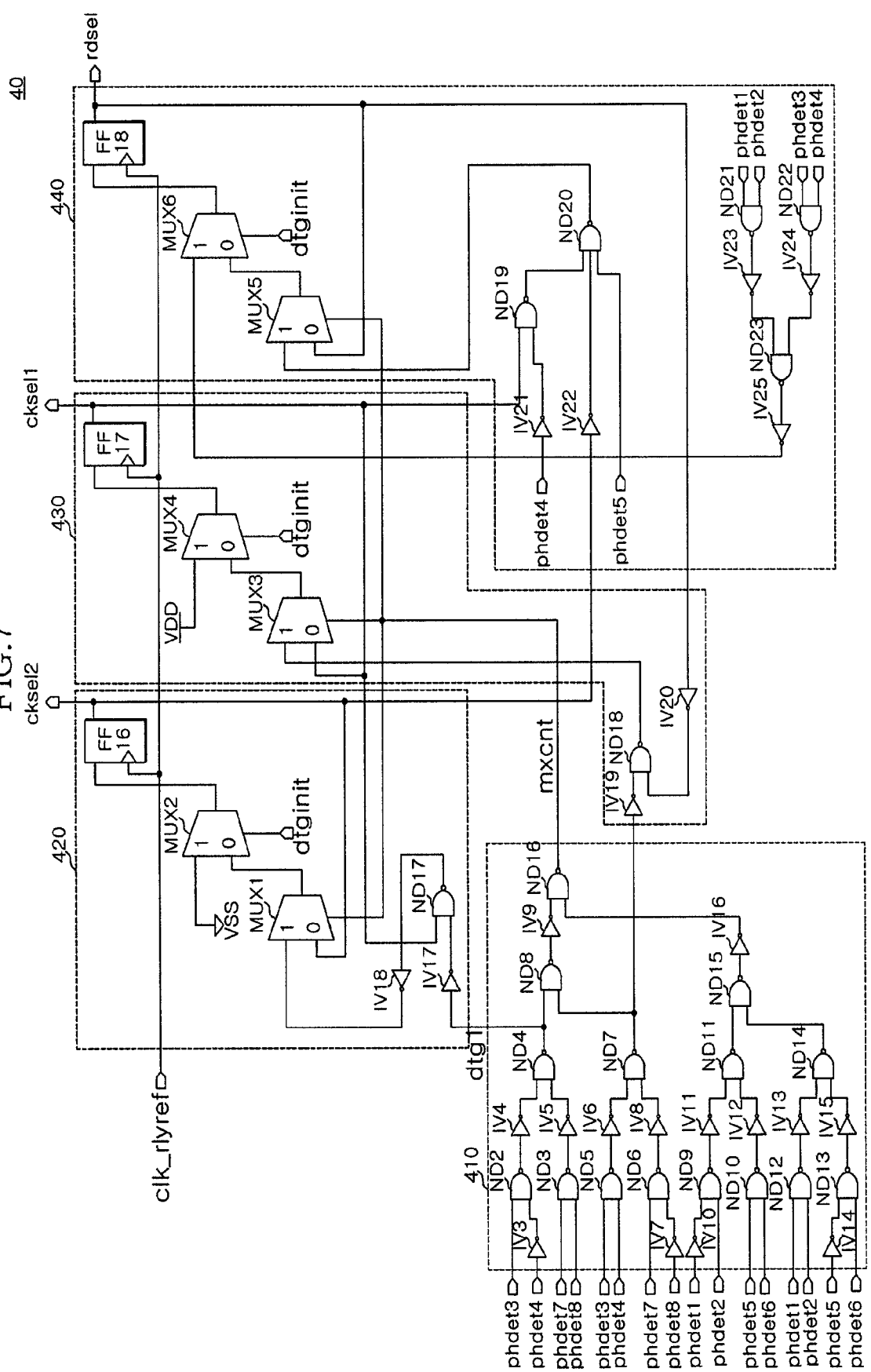
FIG. 7 is a diagram showing the detailed configuration of a timing distinguishing unit that can be included in the circuit illustrated in FIG. 1.

FIG. 7 is a diagram showing the detailed configuration of a timing distinguishing unit that can be included in the circuit illustrated in FIG. 1. Referring to FIG. 7, the timing distinguishing unit 40 can include a state distinguishing section 410, a first signal generating section 420, a second signal generating section 430, and a third signal generating section 440.

The state distinguishing section 410 can combine the first to eighth phase detection signals "phdet1" to "phdet8", and generate a MUX control signal "mxcnt", a first distinguishment signal "dtg1", and a second distinguishment signal "dtg2". The state distinguishing section 410 can include third to sixteenth inverters "IV3" to "IV16", and second to sixteenth NAND gates "ND2" to "ND16".

The third inverter "IV3" can receive the fourth phase detection signal "phdet4". The second NAND gate "ND2" can receive the third phase detection signal "phdet3" and an output signal of the third inverter "IV3". The fourth inverter "IV4" can receive an output signal of the second NAND gate "ND2". The third NAND gate "ND3" can receive the seventh phase detection signal "phdet7" and the eighth phase detection signal "phdet8". The fifth inverter "IV5" can receive an output signal of the third NAND gate "ND3". The fourth NAND gate "ND4" can receives an output signal of the fourth inverter "IV4" and an output signal of the fifth inverter "IV5", and can output the first distinguishment signal "dtg1".

The fifth NAND gate "ND5" can receive the third phase detection signal "phdet3" and the fourth phase detection signal "phdet4". The seventh inverter "IV7" can receive the eighth phase detection signal "phdet8". The sixth NAND gate "ND6" can receive the seventh phase detection signal "phdet7" and an output signal of the seventh inverter "IV7". The eighth inverter "IV8" can receive an output signal of the sixth NAND gate "ND6". The seventh NAND gate "ND7" can receive an output signal of the sixth inverter "IV6" and an output signal of the eighth inverter "IV8", and output the second distinguishment signal "dtg2". The eighth NAND gate "ND8" can receive the first distinguishment signal "dtg1" and the second distinguishment signal "dtg2". The ninth inverter "IV9" can receive an output signal of the eighth NAND gate "ND8".

The tenth inverter "IV10" can receive the first phase detection signal "phdet1". The ninth NAND gate "ND9" can receive an output signal of the tenth inverter "IV10" and the second phase detection signal "phdet2". The eleventh inverter "IV11" can receive an output signal of the ninth NAND gate "ND9". The tenth NAND gate "ND10" can receive the fifth phase detection signal "phdet5" and the sixth phase detection signal "phdet6". The twelfth inverter "IV12" can receive an output signal of the tenth NAND gate "ND10". The eleventh NAND gate ND11 can receive an output signal of the eleventh inverter IV11 and an output signal of the twelfth inverter "IV12".

The twelfth NAND gate "ND12" can receive the first phase detection signal "phdet1" and the second phase detection signal "phdet2". The thirteenth inverter "IV13" can receive an output signal of the twelfth NAND gate "ND12". The fourteenth inverter "IV14" can receive the fifth phase detection signal "phdet5". The thirteenth NAND gate "ND13" can receive an output signal of the fourteenth inverter "IV14" and the sixth phase detection signal "phdet6". The fifteenth inverter "IV15" can receive an output signal of the thirteenth NAND gate "ND13". The fourteenth NAND gate "ND14" can receive an output signal of the thirteenth inverter "IV13" and an output signal of the fifteenth inverter "IV15". The fifteenth NAND gate "ND15" can receive an output signal of the eleventh NAND gate "ND11" and an output signal of the fourteenth NAND gate "ND14". The sixteenth inverter "IV16" can receive an output signal of the fifteenth NAND gate "ND15". The sixteenth NAND gate "ND16" can receive an output signal of the ninth inverter "IV9" and an output signal of the sixteenth inverter "IV16", and outputs the MUX control signal "mxcnt".

The first signal generating section 420 can generate the second clock selection signal "cksel2" from the first distinguishment signal "dtg1" and the first clock selection signal "cksel1" in response to the MUX control signal "mxcnt", the distinguishment initialization signal "dtginit", and the relay reference clock "clk_rlyref". The first signal generating section 420 can include seventeenth and eighteenth inverters "IV17" and "IV18", a seventeenth NAND gate "ND17", first and second MUXs "MUX1" and "MUX2", and a sixteenth flip-flop "FF16".

The seventeenth inverter "IV17" cam receive the first distinguishment signal "dtg1". The seventeenth NAND gate "ND17" can receive an output signal of the seventeenth inverter "IV17" and the first clock selection signal "cksel1". The eighteenth inverter "IV18" can receive an output signal of the seventeenth NAND gate "ND17". The first MUX "MUX1" can selectively pass an output signal of the eighteenth inverter "IV18" or the second clock selection signal "cksel2" in response to the MUX control signal "mxcnt". The second MUX "MUX2" can selectively pass an output signal of the first MUX "MUX1" or a ground voltage "VSS" in response to the distinguishment initialization signal "dtginit". The sixteenth flip-flop "FF16" can latch an output signal of the second MUX "MUX2" in response to the relay reference clock "clk_rlyref", and can output the second clock selection signal "cksel2".

The second signal generating section 430 can generate the first clock selection signal "cksel1" from the second distinguishment signal "dtg2" and the relay data selection signal "rdsel" in response to the MUX control signal "mxcnt", the distinguishment initialization signal "dtginit", and the relay reference clock "clk_rlyref". The second signal generating section 430 can include nineteenth and twentieth inverters "IV19" and "IV20", an eighteenth NAND gate "ND18", third and fourth MUXs "MUX3" and "MUX4", and a seventeenth flip-flop "FF17".

The nineteenth inverter "IV19" can receive the second distinguishment signal "dtg2". The twentieth inverter "IV20" can receive the relay data selection signal "rdsel". The eighteenth NAND gate ND18 can receive an output signal of the nineteenth inverter "IV19" and an output signal of the twentieth inverter "IV20". The third MUX "MUX3" can selectively pass an output signal of the eighteenth NAND gate "ND18" or the first clock selection signal "cksel1" in response to the MUX control signal "mxcnt". The fourth MUX "MUX4" can selectively pass an output signal of the third MUX "MUX3" or the external voltage (VDD) in response to the distinguishment initialization signal "dtginit". The seventeenth flip-flop "FF17" can latch an output signal of the fourth MUX "MUX4" in response to the relay reference clock "clk_rlyref", and can output the first clock selection signal "cksel1".

The third signal generating section 440 can generate the relay data selection signal "rdsel" from the first to fifth phase detection signals "phdet1" to "phdet5" and the first and second clock selection signals "cksel1" and "cksel2" in response to the MUX control signal "mxcnt", the distinguishment initialization signal "dtginit", and the relay reference clock "clk_rlyref". The third signal generating section 440 can include twenty-first to twenty-fifth inverters "IV21" to "IV25", nineteenth to twenty-third NAND gates "ND19" to "ND23", fifth and sixth MUXs "MUX5" and "MUX6", and an eighteenth flip-flop "FF18".

The twenty-first inverter "IV21" can receive the fourth phase detection signal "phdet4". The nineteenth NAND gate "ND19" can receive the first clock selection signal "cksel1" and an output signal of the twenty-first inverter "IV21". The twenty-second inverter "IV22" can receive the second clock selection signal "cksel2". The twentieth NAND gate "ND20" can receive an output signal of the nineteenth NAND gate "ND19", an output signal of the twenty-second inverter "IV22", and the fifth phase detection signal "phdet5". The fifth MUX "MUX5" can selectively passes an output signal of the twentieth NAND gate "ND20" or the relay data selection signal "rdsel" in response to the MUX control signal "mxcnt". The twenty-first NAND gate "ND21" can receive the first phase detection signal "phdet1" and the second phase detection signal phdet2. The twenty-third inverter "IV23" can receive an output signal of the twenty-first NAND gate "ND21". The twenty-second NAND gate "ND22" can receive the third phase detection signal "phdet3" and the fourth phase detection signal "phdet4". The twenty-fourth inverter "IV24" can receive an output signal of the twenty-second NAND gate "ND22". The twenty-third NAND gate "ND23" can receive an output signal of the twenty-third inverter "IV23" and an output signal of the twenty-fourth inverter "IV24". The twenty-fifth inverter "IV25" can receive an output signal of the twenty-third NAND gate "ND23". The sixth MUX "MUX6" can selectively passes an output signal of the twenty-fifth inverter "IV25" or an output signal of the fifth MUX "MUX5" in response to the distinguishment initialization signal "dtginit". The eighteenth flip-flop "FF18" can latch an output signal of the sixth MUX "MUX6" in response to the relay reference clock "clk_rlyref", and output the relay data selection signal "rdsel".

During an initial operation of the timing distinguishing unit 40 having the above-described configuration, if the logical values of the first to fourth phase detection signals "phdet1" to "phdet4" are (1, 1, 1, 1), the first clock selection signal "cksel1", the second clock selection signal "cksel2", and the relay data selection signal "rdsel" can have the logical values of (1, 0, 1). Meanwhile, if any one of the logical values of the first to fourth phase detection signals "phdet1" to "phdet4" is '0', the logical value of the relay data selection signal "rdsel" becomes '0'.

A subsequent operation of the timing distinguishing unit 40 will be described with reference to the following state table. The state table shows that the logical values of the first to eighth phase detection signals "phdet1" to "phdet8" can be changed, and accordingly the logical values of the first and second clock selection signals "cksel1" and "cksel2" and the relay data selection signal "rdsel" can be changed. In the state table, each row can represent the logical values of each signal based on the rising edge of the relay reference clock "clk_rlyref". Accordingly, an upper row can represent the previous state of a lower row. That is, it can be seen that the logical values of the fifth to eighth phase detection signals "phdet5" to "phdet8" are the same as the logical values of the first to fourth phase detection signals "phdet1" to "phdet4" in the upper row.

[State Table]

| phdet1 | phdet2 | phdet3 | phdet4 | Phdet5 | phdet6 | phdet7 | phdet8 | cksel1 | cksel2 | rdsel |
|---|---|---|---|---|---|---|---|---|---|---|
| 1 | 1 | 1 | 0 | 1 | 1 | 1 | 1 | 1 | 1 | 1 |
| 1 | 1 | 1 | 1 | 1 | 1 | 1 | 0 | 1 | 0 | 1 |
| 0 | 1 | 1 | 1 | 1 | 1 | 1 | 1 | 1 | 0 | 0 |
| 1 | 1 | 1 | 1 | 0 | 1 | 1 | 1 | 1 | 0 | 1 |
| 1 | 1 | 1 | 0 | 1 | 1 | 1 | 1 | 1 | 1 | 1 |
| 1 | 1 | 1 | 1 | 1 | 1 | 1 | 0 | 1 | 0 | 1 |

As shown in the state table, the logical value of the MUX control signal "mxcnt" is constantly '1'. The first clock selection signal "cksel1" can have a logical value of '1' when the logical values of the third phase detection signal "phdet3", the fourth phase detection signal "phdet4", the seventh phase detection signal "phdet7", and the eighth phase detection signal "phdet8" are (1, 1, 1, 0), and the logical value of the relay data selection signal "rdsel" in the previous state is '0'. Otherwise, the first clock selection signal "cksel1" can have a logical value of '0'. Here, a case where the logical value of the first clock selection signal "cksel1" is '0' is not provided. The second clock selection signal "cksel2" can have a logical value of '1' when the logical values of the third phase detection signal "phdet3", the fourth phase detection signal "phdet4", the seventh phase detection signal "phdet7", and the eighth phase detection signal "phdet8" are (1, 0, 1, 1), and the logical value of the first clock selection signal "cksel1" in the previous state is '1'. Otherwise, the second clock selection signal "cksel2" has a logical value of '0'. In addition, the relay data selection signal "rdsel" can have a logical value of '0' when the logical value of the second clock selection signal "cksel2" is '0', the logical value of the first clock selection signal "cksel1" is '0' or the logical value of the fourth phase detection signal "phdet4" is '1', and the logical value of the fifth phase detection signal "phdet5" is '1'. Otherwise, the relay data selection signal rdsel has a logical value of '1'.

As such, the timing distinguishing unit 40 can generate the first clock selection signal "cksel1", the second clock selection signal "cksel2", and the relay data selection signal "rdsel" that can be enabled in correspondence with the phase information of the clocks of the receiver and the transmitter to be transmitted by the first to eighth phase detection signals "phdet1" to "phdet8". Subsequently, the first and second clock selection signals "cksel1" and "cksel2" can be transmitted to the switching unit 50 to determine the clock timing. In addition, the relay data selection signal "rdsel" can be transmitted to the data relay unit 60 to determine the data transmission timing.

Figure 8:
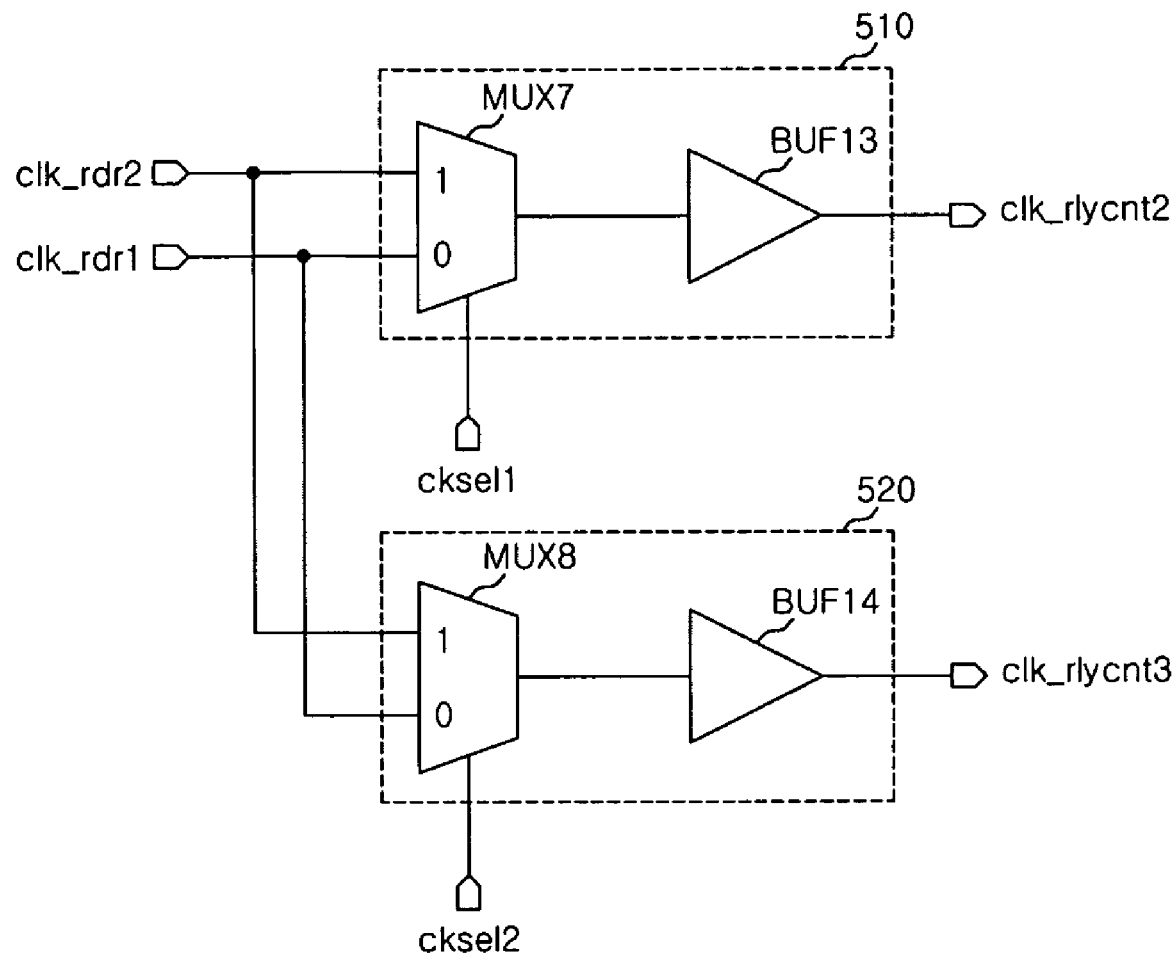
FIG. 8 is a diagram showing the detailed configuration of a switching unit that can be included in the circuit illustrated in FIG. 1.

FIG. 8 is a diagram showing the detailed configuration of a switching unit that can be included in the circuit illustrated in FIG. 1. Referring to FIG. 8, the switching unit 50 can include a first switching section 510 and a second switching section 520.

The first switching section 510 can selectively output the first reception driving clock "clk_rdr1" or the second reception driving clock "clk_rdr2" as the second relay control clock "clk_rlycnt2" in response to the first clock selection signal "cksel1". The first switching section 510 can include a seventh MUX "MUX7" and a thirteenth buffer "BUF13".

The seventh MUX "MUX7" can selectively pass the first reception driving clock "clk_rdr1" or the second reception driving clock "clk_rdr2" in response to the first clock selection signal "cksel1". The thirteenth buffer "BUF13" can receive an output signal of the seventh MUX "MUX7" and output the second relay control clock "clk_rlycnt2".

The second switch 520 can selectively output the first reception driving clock "clk_rdr1" or the second reception driving clock "clk_rdr2" as the third relay control clock "clk_rlycnt3" in response to the second clock selection signal "cksel2". The second switch 520 can include an eighth MUX "MUX8" and a fourteenth buffer "BUF14".

The eighth MUX "MUX8" can selectively pass the first reception driving clock "clk_rdr1" or the second reception driving clock "clk_rdr2" in response to the second clock selection signal "cksel2". The fourteenth buffer "BUF14" can receive an output signal of the eighth MUX MUX8 and output the third relay control clock "clk_rlycnt3".

As described above, the first reception driving clock "clk_rdr1" and the second reception driving clock "clk_rdr2" can have a phase difference from each other by half cycle. In addition, the first clock selection signal "cksel1" and the second clock selection signal "cksel2" can be enabled or not by the operations of the phase detection unit 20 and the timing distinguishing unit 40. That is, the timing of the second and third relay control clocks "clk_rlycnt2" and "clk_rlycnt3" can be determined by the first and second clock selection signals "cksel1" and "cksel2", which can be enabled or not according to the phase states of the receiver clock and the transmitter clock. Subsequently, the generated second and third relay control clocks "clk_rlycnt2" and "clk_rlycnt3" can be transmitted to the data relay unit 60 to be then used for determining the data relay timing.

Figure 9:
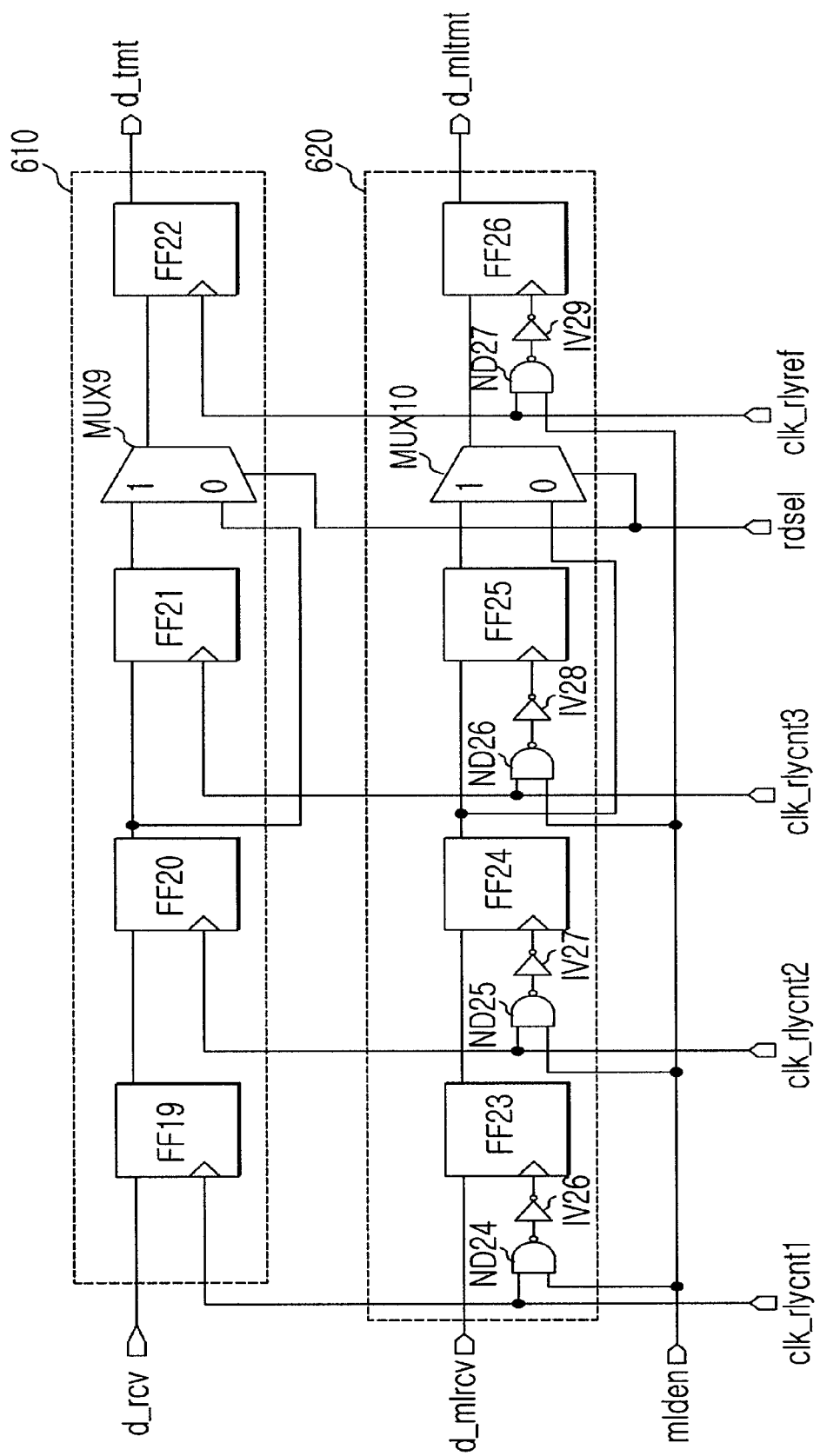
FIG. 9 is a diagram showing the detailed configuration of a data relay unit that can be included in the circuit illustrated in FIG. 1.

FIG. 9 is a diagram showing the detailed configuration of a data relay unit that can be included in the circuit illustrated in FIG. 1. Referring to FIG. 9, the data relay unit 60 can include a received data relay section 610 and a multi-level received data relay section 620.

The received data relay section 610 can output the received data "d_rcv" as the transmitted data "d_tmt" in response to the relay reference clock "clk_rlyref", the relay data selection signal "rdsel", and the first to third relay control clocks "clk_rlycnt1" to "clk_rlycnt3". The received data relay section 610 can includes nineteenth to twenty-second flip-flops "FF19" to "FF22" and a ninth MUX "MUX9".

The nineteenth flip-flop "FF19" can latch the received data "d_rcv" in response to the first relay control clock "clk_rlycnt1". The twentieth flip-flop "FF20" can latch an output signal of the nineteenth flip-flop "FF19" in response to the second relay control clock "clk_rlycnt2". The twenty-first flip-flop "FF21" can latch an output signal of the twentieth flip-flop "FF20" in response to the third relay control clock "clk_rlycnt3". The ninth MUX "MUX9" can selectively pass an output signal of the twentieth flip-flop "FF20" or an output signal of the twenty-first flip-flop "FF21" in response to the relay data selection signal "rdsel". The twenty-second flip-flop FF22 can latch an output signal of the ninth MUX "MUX9" in response to the relay reference clock "clk_rlyref", and output the transmitted data "d_tmt".

The multi-level received data relay section 620 can output the multi-level received data "d_mlrcv" as the multi-level transmitted data "d_mltmt" in response to the multi-level data enable signal "mlden", the relay reference clock "clk_rlyref", the relay data selection signal "rdsel", and the first to third relay control clocks "clk_rlycnt1" to "clk_rlycnt3". The multi-level received data relay section 620 can include twenty-fourth to twenty-seventh NAND gates "ND24" to "ND27", twenty-sixth to twenty-ninth inverters "IV26" to "IV29", twenty-third to twenty-sixth flip-flops "FF23" to "FF26", and a tenth MUX "MUX10".

The twenty-fourth NAND gate "ND24" can receive the multi-level data enable signal "mlden" and the first relay control clock "clk_rlycnt1". The twenty-sixth inverter "IV26" can receive an output signal of the twenty-fourth NAND gate "ND24". The twenty-third flip-flop "FF23" can latch the multi-level received data "d_mlrcv" in response to an output signal of the twenty-sixth inverter "IV26". The twenty-fifth NAND gate "ND25" receives the multi-level data enable signal "mlden" and the second relay control clock "clk_rlycnt2". The twenty-seventh inverter "IV27" can receive an output signal of the twenty-fifth NAND gate "ND25". The twenty-fourth flip-flop "FF24" can latch an output signal of the twenty-third flip-flop "FF23" in response to an output signal of the twenty-seventh inverter "IV27".

The twenty-sixth NAND gate "ND26" can receive the multi-level data enable signal "mlden" and the third relay control clock "clk_rlycnt3". The twenty-eighth inverter "IV28" can receive an output signal of the twenty-sixth NAND gate "ND26". The twenty-fifth flip-flop "FF25" can latch an output signal of the twenty-fourth flip-flop "FF24" in response to an output signal of the twenty-eighth inverter "IV28". The tenth MUX "MUX10" can selectively pass an output signal of the twenty-fourth flip-flop "FF24" or an output signal of the twenty-fifth flip-flop "FF25" in response to the relay data selection signal "rdsel". The twenty-seventh NAND gate "ND27" can receive the multi-level data enable signal "mlden" and the relay reference clock "clk_rlyref. The twenty-ninth inverter "IV29" can receive an output signal of the twenty-seventh NAND gate "ND27". The twenty-sixth flip-flop "FF26" can latch an output signal of the tenth MUX "MUX10" in response to an output signal of the twenty-ninth inverter "IV29", and output the multi-level transmitted data "d_mltmt".

With this configuration, the multi-level received data relay section 620 can perform the data relay operation only when the multi-level data enable signal "mlden" is enabled. The first to third relay control clocks "clk_rlycnt1" to "clk_rlycnt3" and the relay data selection signal "rdsel" can have the information on the timing at which the received data "d_rcv" or the multi-level received data "d_mlrcv" can be output as the received data "d_rcv" or the multi-level received data "d_mlrcv", respectively. Accordingly, the first to third relay control clocks "clk_rlycnt1" to "clk_rlycnt3" and the relay data selection signal "rdsel" can appropriately control the latch timing of each of the flip-flops in the received data relay section 610 and the multi-level received data relay section 620. That is, the output timing of the transmitted data "d_tmt" or the multi-level transmitted data "d_mltmt" can be determined according to the phase difference between the clock of the receiver and the clock of the transmitter. As a result, the phase difference between the clock of the receiver and the clock of the transmitter can be corrected.

Figure 10:
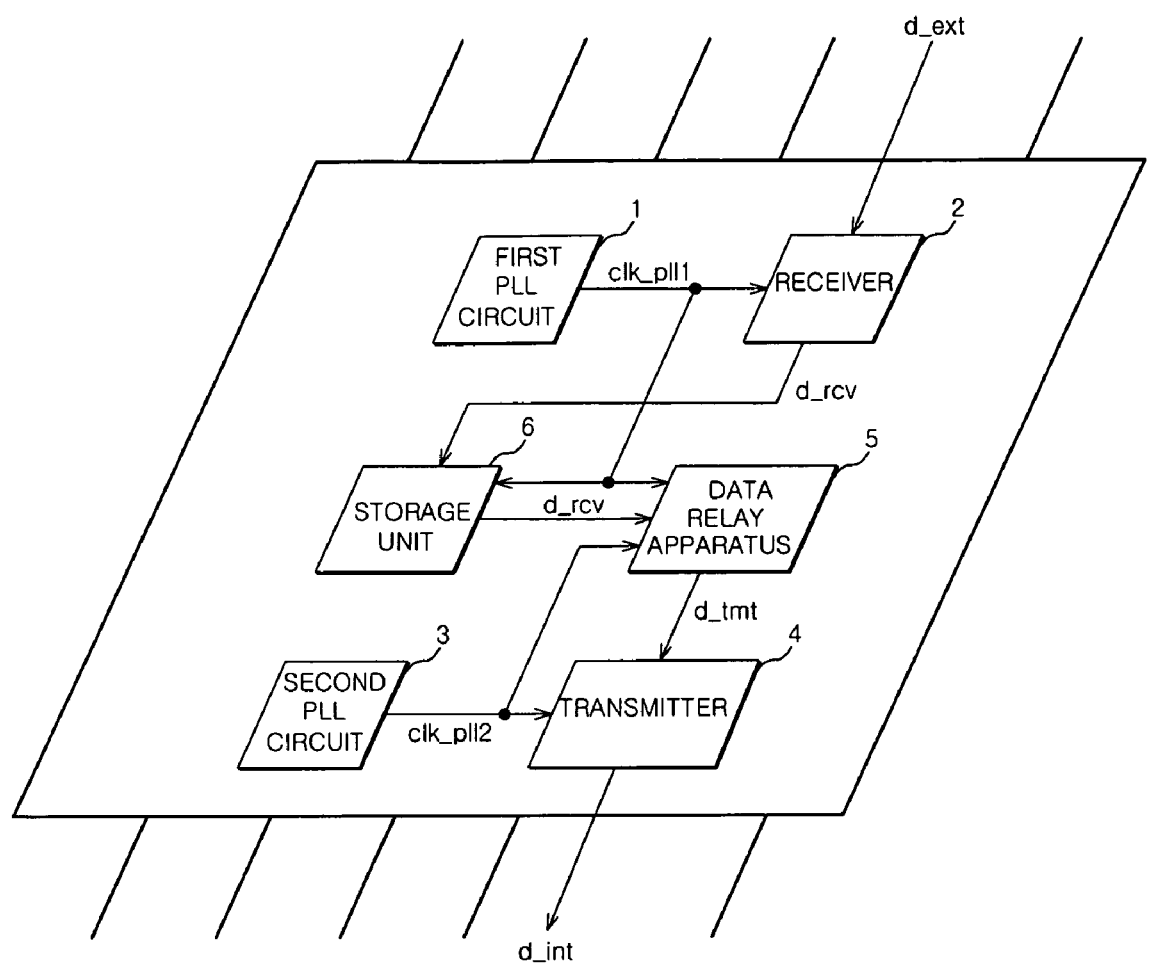
FIG. 10 is a diagram showing an example of a semiconductor integrated circuit having the data relay apparatus that can be included in the circuit illustrated in FIG. 1.

FIG. 10 is a diagram showing an example of a semiconductor integrated circuit having the data relay apparatus that can be included in the circuit illustrated in FIG. 1. As shown in FIG. 10, a semiconductor integrated circuit of can include a first PLL circuit 1, a receiver 2, a second PLL circuit 3, a transmitter 4, a data relay apparatus 5, and a storage unit 6.

The first PLL circuit 1 can generate a first PLL clock "clk_pll1". The receiver 2 can receive data "d_ext" outside a chip, and synchronize the received data with the first PLL clock "clk_pll1". The second PLL circuit 3 can generate a second PLL clock "clk_pll2". The transmitter 4 can transmit data "d_int" inside the chip to the outside of the chip. The data relay apparatus 5 can delay received data "d_rcv" output from the storage unit 6 according to a phase difference between the first PLL clock "clk_pll1" and the second PLL clock "clk_pll2", and can transmit the delayed data to the transmitter 4 as the transmitted data "d_tmt". The storage unit 6 can operate under the control of the first PLL clock "clk_pll1", and store the received data d_rcv transmitted from the receiver 2. The storage unit 6 can be a memory cell block when the semiconductor integrated circuit is a semiconductor memory apparatus.

Figure 11:
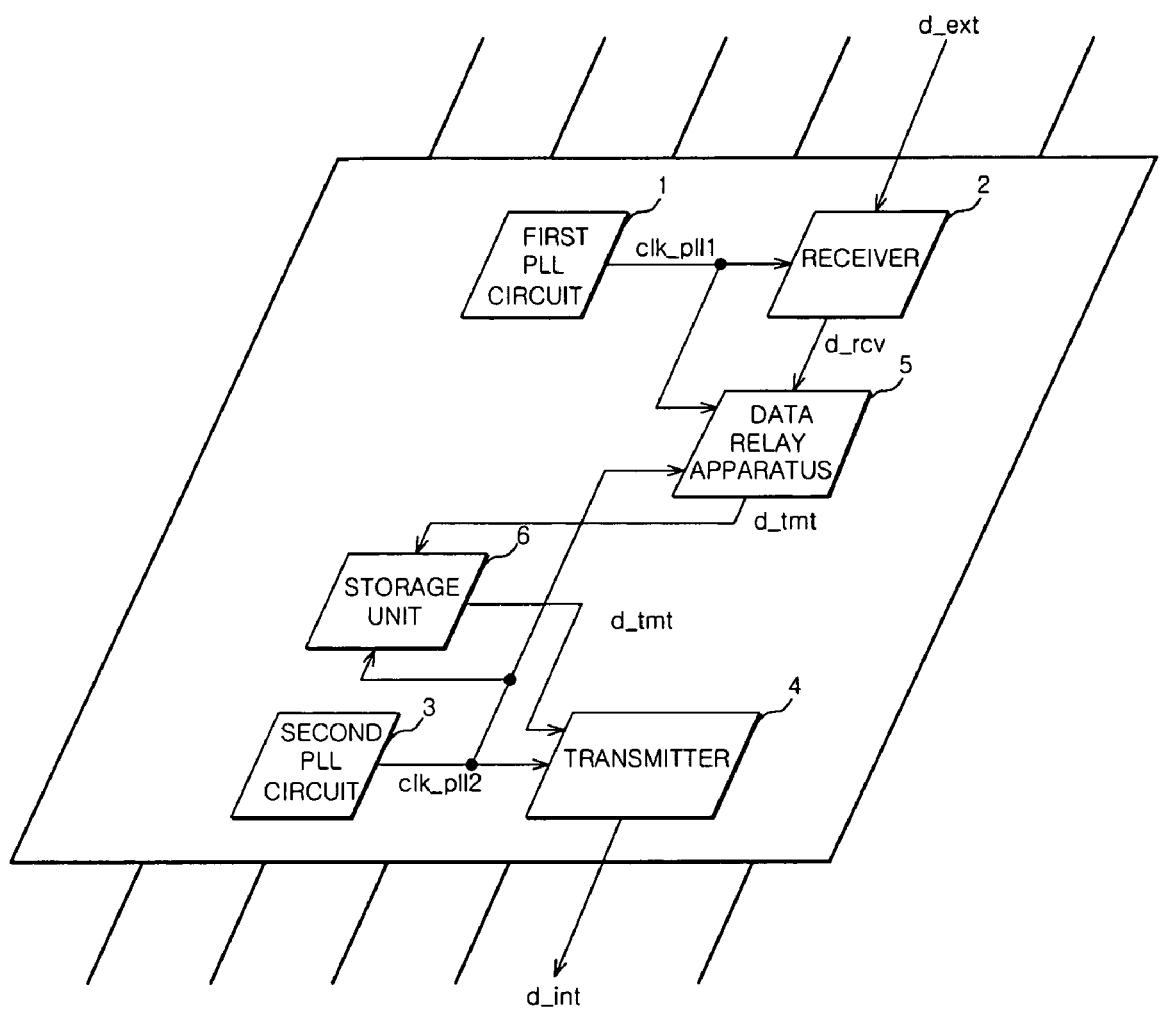
FIG. 11 is a diagram showing another example of a semiconductor integrated circuit having the data relay apparatus that can be included in the circuit illustrated in FIG. 1.

FIG. 11 is a diagram showing another example of a semiconductor integrated circuit having the data relay apparatus that can be included in the circuit illustrated in FIG. 1. As shown in FIG. 11, a semiconductor integrated circuit can include a first PLL circuit 1, a receiver 2, a second PLL circuit 3, a transmitter 4, a data relay apparatus 5, and a storage unit 6.

The first PLL circuit 1 can generate a first PLL clock "clk_pll1". The receiver 2 can receive data "d_ext" outside a chip, and synchronize the received data with the first PLL clock "clk_pll1". The second PLL circuit 3 can generate a second PLL clock "clk_pll2". The transmitter 4 can transmit data "d_int" inside the chip to the outside of the chip. The data relay apparatus 5 can delay received data "d_rcv" output from the receiver 2 according to a phase difference between the first PLL clock "clk_pll1" and the second PLL clock "clk_pll2", and output the delayed data as transmitted data "d_tmt". The storage unit 6 can operate under the control of the second PLL clock "clk_pll2", store the transmitted data "d_tmt" from the data relay apparatus 5, and transmit the stored data to the transmitter 4. The storage unit 6 can be a memory cell block when the semiconductor integrated circuit is a semiconductor memory apparatus.

In the semiconductor integrated circuit according to each example, if the clocks of the receiver 2 and the transmitter 4 have different toggle timing, then the stability of the data transmission operation from the receiver 2 to the transmitter 4 can be deteriorated. In contrast, the data relay apparatus 5, according to one embodiment, can relay data according to the phase difference between the first PLL clock "clk_pll1" and the second PLL clock "clk_pll2", and thus the stability of the data transmission/reception operation of the semiconductor integrated circuit can be improved. Therefore, a high-speed semiconductor integrated circuit can be easily implemented.

In the data relay apparatus according to one embodiment, the clock driving unit can receive the clock of the receiver and the clock of the transmitter, and drive and distribute the received clocks. The phase detection unit can detect the phase difference between the clock of the receiver and the clock of the transmitter, then put the information of the phase difference into a plurality of phase detection signals, and subsequently output the plurality of phase detection signals. At this time, the plurality of phase detection signals can be transmitted to the timing distinguishing unit, and the timing distinguishing unit can generate the first and second clock selection signals and the relay data selection signal, which are respectively enabled according to the information on the phase difference transmitted with the plurality of phase detection signals. The first and second clock selection signals can be transmitted to the switching unit which can be configured to generate the relay control clocks. The relay control clocks and the relay data selection signal can perform an operation to control the transmission timing of the received data in the data relay unit. The data relay unit may perform an operation to relay the multi-level received data according to whether or not the multi-level transmission operation is performed.

The data relay apparatus according to one embodiment can appropriately control the data timing such that the data in the receiver can be synchronized with the clock of the transmitter. Accordingly, stability in the data transmission/reception operation can be markedly improved. In addition, according to the semiconductor integrated circuit having the data relay apparatus, it is possible to overcome a limitation in using a PLL circuit for a high-speed operation. As a result, during a high-speed operation, stable quality can be secured.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data relay apparatus, comprising:
a phase detection unit configured to detect a phase difference between a clock for a transmitter and a clock for a receiver, and generate a plurality of phase detection signals;
a data relay control unit coupled to the phase detection unit, the data relay control unit configured to distinguish a difference in clock timing between the transmitter and the receiver in response to the plurality of phase detection signals, and output a relay data selection signal and a relay control clock; and
a data relay unit coupled to the data relay control unit, the data relay unit configured to transmit data output from the receiver to the transmitter in response to the relay data selection signal and the relay control clock,
wherein the clock for the transmitter includes a plurality of transmission driving clocks, a relay reference clock, and a transmission reference clock, and wherein the clock for the receiver includes a reception reference clock, and wherein the phase detection unit includes an edge trigger configured to detect the level of the reception reference clock at a rising edge of each of the plurality of transmission driving clocks and the relay reference clock.

2. The data relay apparatus of claim 1, wherein the phase detection unit includes:
a first latch section configured to latch the reception reference dock in synchronization with the toggle timing of each of the plurality of transmission driving clocks and the relay reference clock; and
a second latch section configured to latch a plurality of signals output from the first latch section and generate the plurality of phase detection signals in synchronization with the toggle timing of the transmission reference clock.

3. The data relay apparatus of claim 1, wherein the clock for the receiver further includes a first reception driving clock, a second reception driving clock, and the relay control clock includes a first relay control clock and a second relay control clock, and the data relay control unit includes a timing distinguishing unit configured to distinguish the difference in clock timing between the transmitter and the receiver, and generate a relay data selection signal, a first dock selection signal, and a second clock selection signal in response to the relay reference clock and the plurality of phase detection signals, and a switching unit configured to selectively output the first reception driving clock or the second reception driving clock as the first relay control clock and the second relay control clock in response to the first clock selection signal and the second clock selection signal.

4. The data relay apparatus of claim 3, wherein the timing distinguishing unit is configured to generate signals by combining the plurality of phase detection signals in various ways and output the generated signals as the first clock selection signal, the second clock selection signal, and the relay data selection signal under the control of the relay reference clock.

5. The data relay apparatus of claim 4, wherein the timing distinguishing unit includes:
a state distinguishing section configured to combine the plurality of phase detection signals to generate a MUX control signal, a first distinguishment signal and a second distinguishment signal;
a first signal generating section coupled to the state distinguishing section, the first signal generating section configured to generate the second clock selection signal from the first distinguishment signal and the first clock selection signal in response to the MUX control signal and the relay reference clock;
a second signal generating section coupled to the state distinguishing section, the second signal generating section configured to generate the first clock selection signal from the second distinguishment signal and the relay data selection signal in response to the MUX control signal and the relay reference clock; and
a third signal generating section coupled to the state distinguishing section, the third signal generating section configured to generate the relay data selection signal from the plurality of phase detection signals, the first clock selection signal, and the second clock selection signal in response to the MUX control signal and the relay reference clock.

6. The data relay apparatus of claim 5, further comprising:
an initialization unit configured to generate a distinguishment initialization signal, which initializes the operation of the timing distinguishing unit, in response to the relay reference clock and an initialization control signal.

7. The data relay apparatus of claim 3, wherein the switching unit includes:
a first switching section configured to selectively output the first reception driving clock or the second reception driving clock as the first relay control clock in response to the first clock selection signal; and
a second switching section coupled to the first switching section the second switching section configured to selectively output the first reception driving clock or the second reception driving clock as the second relay control clock in response to the second clock selection signal.

8. The data relay apparatus of claim 1, wherein the data relay unit is configured to latch the data output from the receiver under the control of the relay control clock, adjust the timing of the latched data under the control of the relay data selection signal, latch the timing-adjusted data under the control of the relay reference clock, and transmit the latched timing-adjusted data to the transmitter.

9. The data relay apparatus of claim 8, wherein the data relay unit further includes a circuit configured to relay multi-level received data to be transmitted from the receiver in response to a multi-level data enable signal, which defines a multi-level data transmission/reception operation.

10. The data relay apparatus of claim 9, wherein the data relay unit includes:
   a received data relay unit configured to transmit the data output from the receiver to the transmitter in response to the relay reference clock, the relay data selection signal, and the relay control clock; and
   a multi-level received data relay unit coupled to the received data relay unit, the multi-level received delay relay unit configured to transmit the multi-level received data to the transmitter in response to the multi-level data enable signal, the relay reference clock, the relay data selection signal, and the relay control clock.

11. A semiconductor integrated circuit, comprising:
   a first PLL circuit configured to generate a first PLL clock;
   a receiver coupled to the first PLL circuit, the receiver configured to receive data outside a chip and synchronize the received data with the first PLL clock;
   a storage unit coupled to receiver and the first PLL circuit, the storage unit configured to operate under the control of the first PLL clock and store output data of the receiver;
   a second PLL circuit configured to generate a second PLL clock;
   a data relay apparatus coupled to the first PLL circuit, the storage unit, and the second PLL circuit, the data relay apparatus configured to delay output data of the storage unit according to a phase difference between the first PLL clock and the second PLL clock; and
   a transmitter coupled to the second PLL circuit and the data relay apparatus, the transmitter configured to transmit output data of the data relay apparatus to the outside of the chip in synchronization with the second PLL clock,
   wherein the first PLL clock includes a plurality of receiver clocks, and the second PLL clock includes a plurality of transmitter clocks, and the data relay apparatus includes:
   a clock driving unit configured to drive the plurality of receiver clocks to generate a first reception driving clock, a second reception driving clock, and a reception reference clock, and drive the plurality of transmitter clocks to generate a plurality of transmission driving clocks;
   a phase detection unit coupled to the clock driving unit, the phase detection unit configured to detect the phase of the reception reference clock in response to the plurality of transmission driving clocks and generate a plurality of phase detection signals;
   a timing distinguishing unit coupled to the clock driving unit and the phase detection unit, the timing distinguishing unit configured to distinguish the phase difference between the first PLL clock and the second PLL clock in response to the plurality of phase detection signals, and generate a clock selection signal and a relay data selection signal;
   a switching unit coupled to the clock driving unit and the timing distinguishing unit, the switching; unit configured to selectively output the first reception driving clock or the second reception driving clock as a relay control clock in response to the clock selection signal; and
   a data relay unit coupled to the switching unit and the timing distinguishing unit, the data relay unit configured to delay output data of the storage unit in response to the relay data selection signal and the relay control clock, and output the delayed data to the transmitter.

12. The semiconductor integrated circuit of claim 11, wherein the phase detection unit includes an edge trigger configured to detect the level of the reception reference clock at a rising edge of each of the plurality of transmission driving clocks.

13. The semiconductor integrated circuit of claim 11, wherein the timing distinguishing unit is configured to combine the plurality of phase detection signals in various forms to generate signals, and output the generated signals as the clock selection signal and the relay data selection signal.

14. The semiconductor integrated circuit of claim 11, wherein the clock selection signal includes a first clock selection signal and a second clock selection signal, and the relay control clock is configured to includes a first relay control clock and a second relay control clock, and the switching unit is configured to selectively output the first reception driving clock or the second reception driving clock as the first relay control clock in response to the first clock selection signal, and selectively output the first reception driving clock or the second reception driving clock as the second relay control clock in response to the second clock selection.

15. The semiconductor integrated circuit of claim 11, wherein the data relay unit is configured to latch the output data of the storage unit under the control of the relay control clock, adjust the timing of the latched data under the control of the relay data selection signal, and transmit the timing-adjusted data to the transmitter.

16. The semiconductor integrated circuit of claim 11, wherein the data relay apparatus further includes: an initialization unit configured to generate a distinguishment initialization signal, which initializes the operation of the timing distinguishing unit, in response to an initialization control signal.

17. A semiconductor integrated circuit, comprising:
   a first PLL circuit configured to generate a first PLL clock;
   a receiver coupled to the first circuit, the receiver configured to receive data outside a chip and synchronize the received data with the first PLL dock;
   a second PLL circuit configured to generate a second PLL clock;
   a data relay apparatus coupled to the second PLL circuit, the data relay apparatus configured to delay output data of the receiver according to a phase difference between the first PLL dock and the second PLL clock;
   a storage unit coupled to the data relay apparatus and the second PLL circuit, the storage unit configured to operate under the control of the second PLL clock and stores output data of the data relay apparatus; and
   a transmitter coupled to the second PLL circuit and the storage unit, the transmitter configured to transmit output data of the storage unit to the outside of the chip in synchronization with the second PLL clock, wherein the first PLL clock includes a plurality of receiver clocks, and the second PLL clock includes a plurality of transmitter clocks, and the data relay apparatus includes:
   a clock driving unit configured to drive the plurality of receiver clocks to generate a first reception driving clock, a second reception driving clock, and a reception reference clock, and drive the plurality of transmitter clocks to generate a plurality of transmission driving clocks;

a phase detection unit coupled to the clock driving unit, the phase detection unit configured to detect the phase of the reception reference clock in response to the plurality of transmission driving clocks and generate a plurality of phase detection signals;

a timing distinguishing unit coupled to the phase detection unit and the clock driving unit, the timing distinguishing unit configured to distinguish the phase difference between the first PLL clock and the second PLL clock in response to the plurality of phase detection signals, and generate a clock selection signal and a relay data selection signal;

a switching unit configured to selectively outputs the first reception driving clock or the the switching unit configured to selectively outputs the first reception driving clock or the second reception driving clock as a relay control clock in response to the clock selection signal; and a data relay coupled to the switching unit and the timing distinguishing unit, the data relay unit configured to delay output data of the receiver in response to the relay data selection signal and the relay control clock, and transmit the delayed data to the storage unit.

18. The semiconductor integrated circuit of claim 17, wherein the phase detection unit includes an edge trigger configured to detect the level of the reception reference clock at a rising edge of each of the plurality of transmission driving clocks.

19. The semiconductor integrated circuit of claim 17, wherein the timing distinguishing unit is configured to combine the plurality of phase detection signals in various forms to generate signals, and output the generated signals as the clock selection signal and the relay data selection signal.

20. The semiconductor integrated circuit of claim 17, wherein the dock selection signal includes a first clock selection signal and a second clock selection signal, and the relay control clock includes a first relay control clock and a second relay control clock, and the switching unit is configured to selectively output the first reception driving clock or the second reception driving clock as the first relay control clock in response to the first clock selection signal, and selectively output the first reception driving clock or the second reception driving clock as the second relay control clock in response to the second clock selection signal.

21. The semiconductor integrated circuit of claim 17, wherein the data relay unit is configured to latch data in the receiver under the control of the relay control clock, adjust the timing of the latched data under the control of the relay data selection signal, and transmit the timing-adjusted data to the storage unit.

22. The semiconductor integrated circuit of claim 17, wherein the data relay apparatus further includes: an initialization unit configured to generate a distinguishment initialization signal, which initializes the operation of the timing distinguishing unit, in response to an initialization control signal.

\* \* \* \* \*